United States Patent
Yanagi

(10) Patent No.: US 9,622,349 B2
(45) Date of Patent: Apr. 11, 2017

(54) CONTROL DEVICE, AND MOTOR UNIT INCLUDING CONTROL DEVICE

(71) Applicant: JTEKT CORPORATION, Osaka-shi, Osaka (JP)

(72) Inventor: Takuya Yanagi, Toyota (JP)

(73) Assignee: JTEKT CORPORATION, Osaka-shi (JP)

( * ) Notice: Subject to any disclaimer, the term of this patent is extended or adjusted under 35 U.S.C. 154(b) by 370 days.

(21) Appl. No.: 13/872,390

(22) Filed: Apr. 29, 2013

(65) Prior Publication Data
US 2013/0301229 A1    Nov. 14, 2013

(30) Foreign Application Priority Data

May 10, 2012    (JP) ................................ 2012-108510

(51) Int. Cl.
| | |
|---|---|
| H05K 1/14 | (2006.01) |
| H05K 1/02 | (2006.01) |
| H02K 11/33 | (2016.01) |
| H02K 5/22 | (2006.01) |
| H02K 9/22 | (2006.01) |

(52) U.S. Cl.
CPC ............. *H05K 1/14* (2013.01); *H02K 5/225* (2013.01); *H02K 11/33* (2016.01); *H05K 1/0201* (2013.01); *H05K 1/0203* (2013.01); *H05K 1/141* (2013.01); *H05K 1/144* (2013.01); *H02K 9/22* (2013.01); *H02K 2213/03* (2013.01)

(58) Field of Classification Search
CPC ....... H05K 1/0201–1/0212; H05K 1/14–1/148
USPC .................. 361/718–721, 784, 790
See application file for complete search history.

(56) References Cited

U.S. PATENT DOCUMENTS

| | | | | |
|---|---|---|---|---|
| 5,478,972 A | * | 12/1995 | Mizutani | ............... H05K 3/4038 174/250 |
| 2009/0225523 A1 | | 9/2009 | Onishi et al. | |
| 2010/0328901 A1 | | 12/2010 | Minato et al. | |
| 2011/0286185 A1 | | 11/2011 | Abe et al. | |

FOREIGN PATENT DOCUMENTS

| | | | | |
|---|---|---|---|---|
| DE | EP 1921903 A2 | * | 5/2008 | ............. H05K 1/141 |
| EP | 2312731 A2 | | 4/2011 | |
| JP | H11-135965 A | | 5/1999 | |
| JP | 2002-271068 A | | 9/2002 | |
| JP | A-2008-41718 | | 2/2008 | |
| JP | 2009-177869 A | | 8/2009 | |

OTHER PUBLICATIONS

Feb. 9, 2016 Office Action issued in Japanese Application No. 2012-108510.
Jul. 25, 2016 Extended European Search Report issued in European Patent Application No. 13166393.2.

* cited by examiner

Primary Examiner — Ramon M Barrera
(74) *Attorney, Agent, or Firm* — Oliff PLC

(57) ABSTRACT

A control device includes: a metal housing having a bottom wall and a side wall; a first circuit board having a principal surface, the principal surface facing the bottom wall; and a second circuit board upright to the first circuit board, and having a principal surface and a power element, the power element being mounted on the principal surface and facing the side wall.

3 Claims, 7 Drawing Sheets

CONTROL DEVICE, AND MOTOR UNIT INCLUDING CONTROL DEVICE

INCORPORATION BY REFERENCE

The disclosure of Japanese Patent Application No. 2012-108510 filed on May 10, 2012 including the specification, drawings and abstract is incorporated herein by reference in its entirety.

BACKGROUND OF THE INVENTION

Field of the Invention

The invention relates to a control device that includes a first circuit board and a second circuit board that has a power element, and a motor unit including the control device.

Description of Related Art

A control device described in Japanese Patent Application Publication No. 2008-41718 (JP 2008-41718 A) includes a circuit board and a plurality of circuit elements.

In the above-described control device, all the circuit elements are mounted on the planar single circuit board. Therefore, it is difficult to reduce the size of the circuit board in the plane direction in the control device.

SUMMARY OF THE INVENTION

The invention provides a control device that allows a reduction in size in the plane direction of a circuit board, and a motor unit including the control device.

A first aspect of the invention provides a control device. The control device includes: a metal housing having a bottom wall and a side wall; a first circuit board having a first principal surface, the first principal surface facing the bottom wall; and a second circuit board upright with respect to the first circuit board, and having a second principal surface and a power element, the power element being mounted on the second principal surface and facing the side wall.

With the above control device, the second circuit board is upright with respect to the first circuit board, so it is possible to reduce the size of the first circuit board in the plane direction in the control device. In addition, in the control device, heat of the power element is transferred to the side wall of the housing. Therefore, a rise in the temperature of the power element is suppressed.

In the control device according to the above aspect, the first circuit board may have a first back surface and a connector, the first back surface being a surface across the first circuit board from the first principal surface, the connector being mounted on the first back surface, the housing may have a metal connector support portion, the connector support portion being arranged between the bottom wall and the first principal surface, a portion of the first principal surface, corresponding to the connector, may be supported by the connector support portion, and the second circuit board may be mounted on the connector support portion.

With the above control device, the portion of the first principal surface, corresponding to the connector, is supported by the connector support portion, so a load that acts on the first circuit board as a result of mounting of a device on the connector is received by the connector support portion. Therefore, deformation of the first circuit board is suppressed. In addition, in the control device, heat of the second circuit board flows to the connector support portion. Therefore, a rise in the temperature of the second circuit board is suppressed.

A second aspect of the invention provides a control device. The control device includes: a metal housing having a bottom wall, a side wall and a connector support portion, the side wall and the connector support portion being upright with respect to the bottom wall; a first circuit board having a first principal surface, a first back surface and a connector, the first principal surface facing the bottom wall, the connector being mounted on the first back surface, a portion of the first principal surface, corresponding to the connector, being supported by the connector support portion; and a second circuit board upright with respect to the first circuit board, and having a second principal surface, a second back surface and a power element, the second principal surface facing the connector support portion, the second back surface contacting the side wall, the power element being mounted on the second principal surface.

With the above control device, the second circuit board is upright with respect to the first circuit board, so it is possible to reduce the size of the first circuit board in the plane direction in the control device. In addition, in the control device, the portion of the first principal surface, corresponding to the connector, is supported by the connector support portion, so a load that acts on the first circuit board as a result of mounting of a device on the connector is received by the connector support portion. Therefore, deformation of the first circuit board is suppressed. In addition, in the control device, heat of the second circuit board flows to the connector support portion. Therefore, a rise in the temperature of the second circuit board is suppressed.

In the control device according to the above aspect, the first circuit board may be a multilayer printed circuit board in which a plurality of thermoplastic resin films are laminated.

A third aspect of the invention provides a motor unit that includes the control device according to the above aspect.

According to the aspects of the invention, it is possible to provide the control device that allows a reduction in size in the plane direction of the circuit board, and the motor unit including the control device.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

First Embodiment

Figure 1:
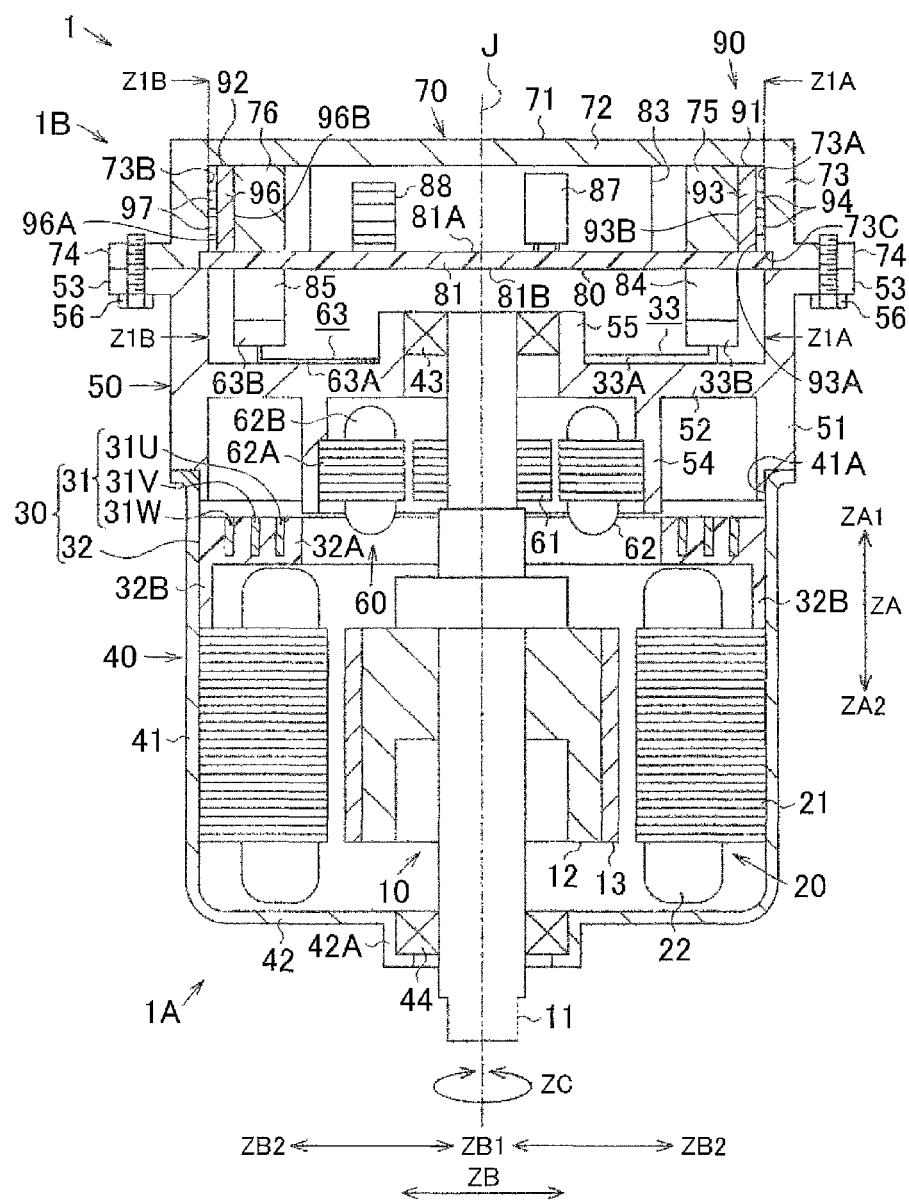
FIG. 1 is a sectional view of a motor unit according to a first embodiment of the invention, and is a sectional view that shows a sectional structure along a plane in an axial direction.

The configuration of a motor unit 1 according to the present embodiment will be described with reference to FIG. 1. The motor unit 1 includes an electric motor 1A and a control device 1B. The electric motor 1A includes a rotor 10, a stator 20, a bus bar 30, a motor housing 40, ball bearings 43, 44, a bracket 50 and a resolver 60. The control device 1B includes a housing 70, a first circuit board 80 and a second circuit board 90. The control device 1B controls the operation of the electric motor 1A.

The directions of the motor unit 1 are defined as follows.
(A) A direction along a central axis (hereinafter, "central axis J") of the rotor 10 is termed "axial direction ZA". A direction perpendicular to the axial direction ZA is termed "radial direction ZB". A direction in which the rotor 10 rotates is termed "circumferential direction ZC".
(B) In the axial direction ZA, a direction that passes through the electric motor 1A and the control device 1B sequentially is termed "upward direction ZA1". In the axial direction ZA, a direction that passes through the control device 1B and the electric motor 1A sequentially is termed "downward direction ZA2".
(C) In the radial direction ZB, a direction that approaches the central axis J is termed "inward direction ZB1". In the radial direction ZB, a direction that distances from the central axis J is termed "outward direction ZB2".

The rotor 10 includes the output shaft 11, a rotor core 12 and a permanent magnet 13. The rotor core 12 is formed of a magnetic material. The rotor core 12 has a cylindrical shape. The rotor core 12 is press-fitted to the output shaft 11. The permanent magnet 13 is fixed to the outer periphery of the rotor core 12. The permanent magnet 13 has ten magnetic poles in the circumferential direction ZC.

The stator 20 forms a magnetic field for generating the rotation force of the rotor 10 with currents that are supplied from a power supply (not shown). The stator 20 includes a stator core 21 and a field unit 22. Magnetic fluxes of the field unit 22 pass through the stator core 21. The stator core 21 has such a structure that a plurality of magnetic steel sheets are laminated. The stator core 21 is press-fitted to the inner periphery of a stator holding portion 41 of the motor housing 40. The field unit 22 forms magnetic fields therearound by currents supplied from the power supply. The field unit 22 forms concentrated windings by winding conductive lines around the stator core 21. The field unit 22 includes four U-phase coils, four V-phase coils and four W-phase coils.

The bus bar 30 includes copper plates 31, a support member 32 and a circuit connection member 33. The bus bar 30 is located in the upward direction ZA1 with respect to the stator core 21. The bus bar 30 is connected to the stator core 21. The bus bar 30 electrically connects the stator 20 and the second circuit board 90 via the first circuit board 80.

The copper plates 31 include a U-phase copper plate 31U, a V-phase copper plate 31V and a W-phase copper plate 31W. Coil end portions of the U-phase coils are connected to the U-phase copper plate 31U. Coil end portions of the V-phase coils are connected to the V-phase copper plate 31V. Coil end portions of the W-phase coils are connected to the W-phase copper plate 31W.

The support member 32 has a copper plate support portion 32A and three leg portions 32B. The support member 32 has such a structure that the copper plate support portion 32A and the leg portions 32B are integrally molded from the same resin material. The copper plate support portion 32A has an annular shape. The copper plate support portion 32A supports the copper plates 31. The leg portions 32B extend in the downward direction ZA2 from the outer peripheral portion of the copper plate support portion 32A. The leg portions 32B are spaced apart from each other in the circumferential direction ZC. The leg portions 32B are connected to the outer peripheral portion of the stator core 21 at their lower end portions.

Figure 2:
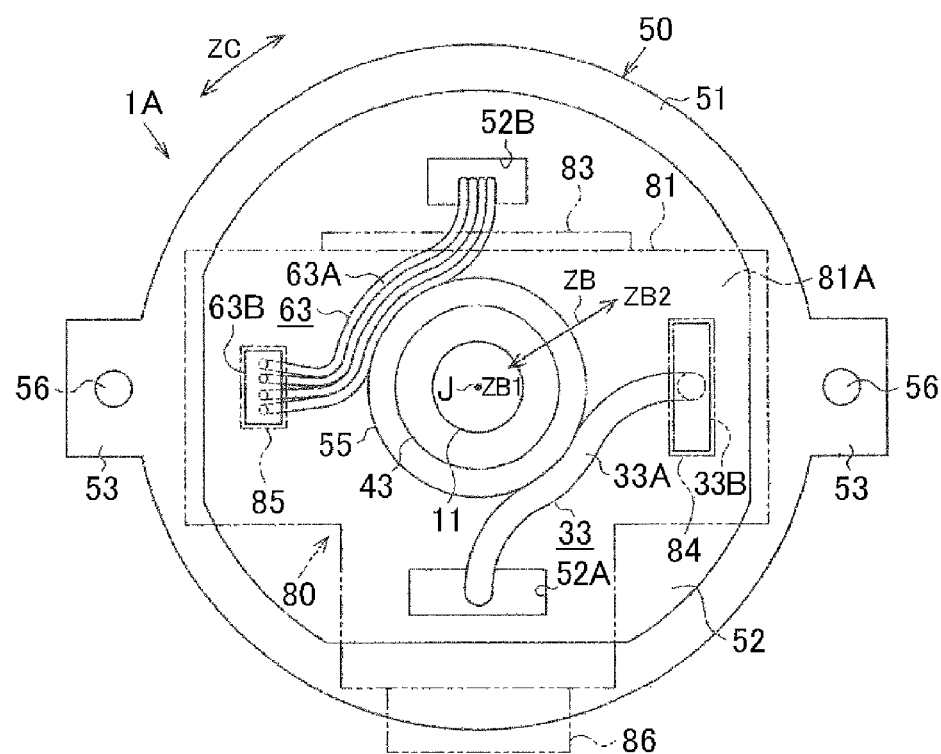
FIG. 2 is a plan view that shows a planar structure of an electric motor according to the first embodiment.

The circuit connection member 33 electrically connects the copper plates 31 and the first circuit board 80 to each other. The circuit connection member 33 includes a lead 33A and a connector portion 33B. The lead 33A is fixed to the copper plates 31 at one end portion. The lead 33A is connected to the connector portion 33B at the other end portion. The lead 33A is drawn to a side in the upward direction ZA1 beyond a cover portion 52 of the bracket 50 via a bus bar through-hole 52A (see FIG. 2). The connector portion 33B is fitted to a bus bar connector 84.

The motor housing 40 has the stator holding portion 41 and a cover portion 42. The motor housing 40 has such a structure that the stator holding portion 41 and the cover portion 42 are integrally formed from the same metal plate. The motor housing 40 accommodates part of the rotor 10, the stator 20 and the bus bar 30.

The stator holding portion 41 has a cylindrical shape. The stator holding portion 41 has an opening portion 41A. The opening portion 41A opens in the upward direction ZA1 at the upper end portion of the stator holding portion 41. The cover portion 42 has a bearing support portion 42A. The cover portion 42 closes the lower end portion of the stator holding portion 41.

The ball bearing 43 is press-fitted to the upper end portion of the output shaft 11. The ball bearing 43 is fixed to the bearing support portion 55. The ball bearing 43 supports the output shaft 11 in a state where the rotor 10 is rotatable relative to the stator 20.

The ball bearing 44 is press-fitted to the lower end portion of the output shaft 11. The ball bearing 44 is fixed to the bearing support portion 42A. The ball bearing 44 supports the output shaft 11 in a state where the rotor 10 is rotatable relative to the stator 20.

The bracket 50 is fixed to the opening portion 41A of the motor housing 40. The bracket 50 closes the opening portion 41A. The bracket 50 has a side wall 51, the cover portion 52, a mounting portion 53, a resolver support portion 54 and the bearing support portion 55. The bracket 50 has such a structure that the side wall 51, the cover portion 52, the mounting portion 53, the resolver support portion 54 and the bearing support portion 55 are integrally molded from the same metal material.

The side wall 51 has a cylindrical shape. The side wall 51 is fixed to the opening portion 41A of the motor housing 40. The side wall 51 has a connector through-hole (not shown). The cover portion 52 is located in the middle portion of the side wall 51 in the axial direction ZA. The cover portion 52 closes the opening portion 41A. The cover portion 52 has the bus bar through-hole 52A and a resolver through-hole 52B (see FIG. 2). The mounting portion 53 extends in the outward direction ZB2 from the upper end portion of the side wall 51. The mounting portion 53 is fixed to the mounting portion 74 of the housing 70 by bolts 56. The resolver support portion 54 has a cylindrical shape. The resolver support portion 54 extends in the downward direction ZA2 from the cover portion 52. The bearing support portion 55 has a cylindrical shape. The bearing support portion 55 is located in the inward direction ZB1 with respect to the resolver support portion 54. The bearing support portion 55 extends in the upward direction ZA1 from the cover portion 52.

The resolver 60 is located in the upward direction ZA1 with respect to the bus bar 30 and in the inward direction ZB1 with respect to the bus bar 30. The resolver 60 outputs a voltage signal, corresponding to the rotation position of the rotor 10, to the first circuit board 80. The resolver 60 includes a resolver rotor 61, a resolver stator 62 and a circuit connection member 63. The resolver 60 is a variable-reluctance resolver.

The resolver rotor 61 is press-fitted to the output shaft 11. The resolver stator 62 is fixed to the resolver support portion 54. The resolver stator 62 has a resolver core 62A and a resolver field unit 62B. The resolver core 62A is press-fitted to the resolver support portion 54. The resolver field unit 62B is formed of conductive lines wound around the resolver core 62A.

The circuit connection member 63 electrically connects coil end portion of the resolver field unit 62B and the first circuit board 80 to each other. The circuit connection member 63 has a lead 63A and a connector portion 63B. The lead 63A is fixed to the coil end portions of the resolver field unit 62B at one end portion. The lead 63A is connected to the connector portion 63B at the other end portion. The lead 63A is drawn to a side in the upward direction ZA1 beyond the cover portion 52 of the bracket 50 via the resolver through-hole 52B (see FIG. 2). The connector portion 63B is fitted to a resolver connector 85.

The housing 70 is located at the upper end portion of the motor unit 1. The housing 70 covers the bracket 50 from a side in the upward direction ZA1. The housing 70 is fixed to the bracket 50 by the bolts 56. The housing 70 has a housing body 71, a bus bar connector support portion 75 and a resolver connector support portion 76. In the housing 70, the housing body 71, the bus bar connector support portion 75 and the resolver connector support portion 76 are individually formed. The bus bar connector support portion 75 and the resolver connector support portion 76 correspond to "connector support portion".

The housing body 71 has a bottom wall 72, a side wall 73 and the mounting portion 74. The housing body 71 has such a structure that the bottom wall 72, the side wall 73 and the mounting portion 74 are integrally molded from the same metal material. The bottom wall 72 has a disc shape oriented in the radial direction ZB. The side wall 73 has a cylindrical shape. The side wall 73 extends in the downward direction ZA2 from the outer peripheral edge of the bottom wall 72. The side wall 73 has a first flat portion 73A, a second flat portion 73B and a step portion 73C. The side wall 73 supports the first circuit board 80 at the step portion 73C. The first flat portion 73A of the side wall 73 faces the bus bar connector support portion 75 in the radial direction ZB. The second flat portion 73B of the side wall 73 faces the resolver connector support portion 76 in the radial direction ZB. The mounting portion 74 extends in the outward direction ZB2 from the lower end portion of the side wall 73. The mounting portion 74 is located at a portion that corresponds to the mounting portion 53 of the bracket 50.

The bus bar connector support portion 75 is formed of a metal material. The bus bar connector support portion 75 has a quadrangular prism shape having a rectangular shape in plan view. The bus bar connector support portion 75 is parallel to the first flat portion 73A of the side wall 73. The bus bar connector support portion 75 is located across a space from the first flat portion 73A. The lower end surface of the bus bar connector support portion 75 contacts a principal surface 81A of a circuit board body 81 of the first circuit board 80. The bus bar connector support portion 75 is fixed to the bottom wall 72 by a bolt (not shown). The bus bar connector support portion 75 is larger than the size of the bus bar connector 84 in the longitudinal direction of the bus bar connector 84 (see FIG. 4A). The bus bar connector support portion 75 is located at a portion corresponding to the bus bar connector 84.

The resolver connector support portion 76 is formed of a metal material. The resolver connector support portion 76 has a quadrangular prism shape having a rectangular shape in plan view. The resolver connector support portion 76 is parallel to the second flat portion 73B of the side wall 73. The resolver connector support portion 76 is located across a space from the second flat portion 73B. The lower end surface of the resolver connector support portion 76 contacts the principal surface 81A of the circuit board body 81 of the first circuit board 80. The resolver connector support portion 76 is fixed to the bottom wall 72 via a bolt (not shown). The resolver connector support portion 76 is larger than the size of the resolver connector 85 in the longitudinal direction of the resolver connector 85 (see FIG. 4B). The resolver connector support portion 76 is located at a portion corresponding to the resolver connector 85.

The configuration of the first circuit board 80 will be described with reference to FIG. 1 and FIG. 3B. The first circuit board 80 is located in the upward direction ZA1 across a space from the cover portion 52 of the bracket 50. The first circuit board 80 has the circuit board body 81, a coupling portion 82 (see FIG. 3A) and a perpendicular board portion 83. The first circuit board 80 has a control circuit that controls switching operations of power elements 94, 97 of the second circuit board 90. A voltage signal based on an induced voltage of the resolver field unit 62B is input to the first circuit board 80 via the circuit connection member 63.

The first circuit board 80 is formed as a multilayer printed circuit board in which a plurality of thermoplastic resin films are laminated. The first circuit board 80 has through-holes each having a conductor pattern as its bottom face and inter-layer connecting portions (not shown) formed of electrically conductive paste filled in the through-holes. The first circuit board 80 is formed by thermo-compression bonding in a state where the thermoplastic resin films having conductor patterns and electrically conductive paste are laminated.

The circuit board body 81 has a planar shape oriented in the radial direction ZB. The circuit board body 81 has a T shape in plan view (see FIG. 3A). The circuit board body 81 is located at the step portion 73C of the housing 70. The circuit board body 81 has the principal surface 81A, a back surface 81B, the bus bar connector 84, the resolver connector 85, an external connector 86 (see FIG. 3A), electrolytic capacitors 87 and a toroidal coil 88. In the circuit board body 81, the bus bar connector 84 and the resolver connector 85 are mounted on the back surface 81B. The principal surface 81A of the circuit board body 81 faces the bottom wall 72. In the circuit board body 81, the electrolytic capacitors 87 and the toroidal coil 88 are mounted on the principal surface 81A. The principal surface 81A corresponds to "first principal surface". The back surface 81B corresponds to "first back surface". The bus bar connector 84 and the resolver connector 85 correspond to "connector".

Figure 3A:
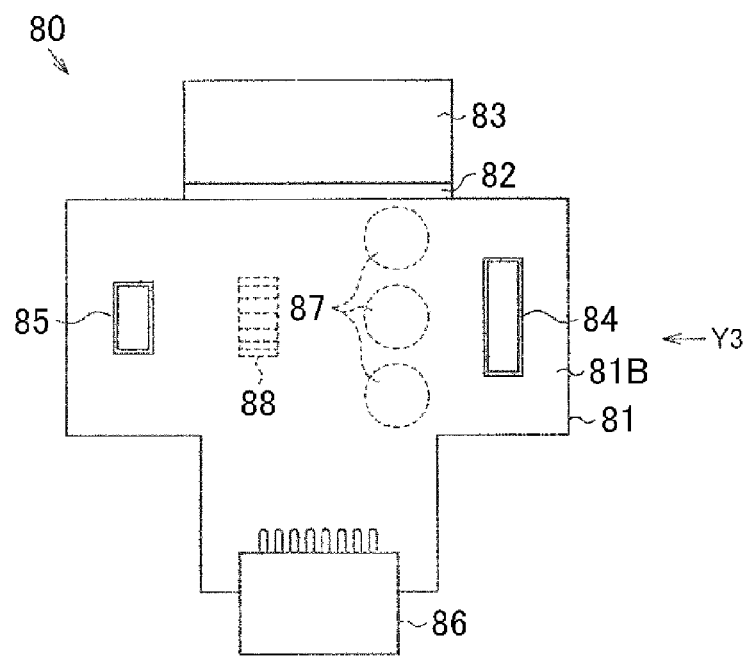
FIG. 3A is a developed view that shows a developed structure of a first circuit board of a control device according to the first embodiment.
Figure 3B:
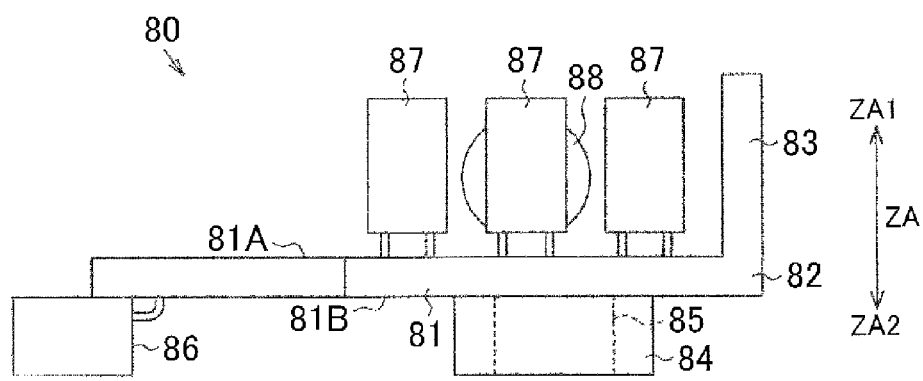
FIG. 3B is a side view that shows a side structure when viewed from the arrow Y3 in FIG. 3A after the first circuit board of the control device according to the first embodiment is bent.

The coupling portion 82 couples the circuit board body 81 and the perpendicular board portion 83 to each other (see FIG. 3A). The coupling portion 82 is bent (see FIG. 3B). The perpendicular board portion 83 has a planar shape oriented in the axial direction ZA. The perpendicular board portion 83 is upright with respect to the circuit board body 81. The perpendicular board portion 83 extends in the upward direction ZA1 from the circuit board body 81 (see FIG. 3B).

The configuration of the second circuit board 90 will be described with reference to FIG. 4A and FIG. 4B. The second circuit board 90 constitutes a power circuit from the six power elements 94, 97. The second circuit board 90 includes a first power board 91 and a second power board 92.

Figure 4A:
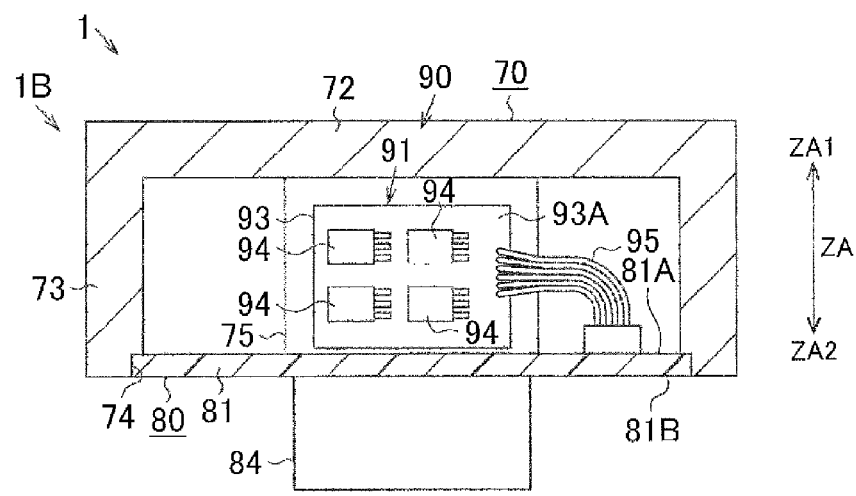
FIG. 4A is a sectional view that shows a sectional structure of the control device according to the first embodiment along the Z1A-Z1A plane in FIG. 1.

As shown in FIG. 4A, the first power board 91 is fixed to the side surface of the bus bar connector support portion 75. The first power board 91 has a planar shape oriented in the axial direction ZA. The first power board 91 faces the first flat portion 73A of the side wall 73 (see FIG. 1). The first power board 91 includes a ceramic board 93, four field-effect transistors that serve as the power elements 94, and a harness 95.

The ceramic board 93 is formed of alumina. The ceramic board 93 has a planar shape oriented in the axial direction ZA. The size of the ceramic board 93 is larger than the size of a ceramic board 96 (see FIG. 4B) of the second power board 92. The ceramic board 93 has a principal surface 93A and a back surface 93B (see FIG. 1). In the ceramic board 93, the power elements 94 are mounted on the principal surface 93A. The back surface 93B (see FIG. 1) of the ceramic board 93 is fixed to the bus bar connector support portion 75. The principal surface 93A corresponds to "second principal surface". The back surface 93B corresponds to "second back surface".

The power elements 94 contact the first flat portion 73A at portions across from the ceramic board 93 (see FIG. 1). One end of the harness 95 is connected to the principal surface 93A of the ceramic board 93, and the other end of the harness 95 is connected to the principal surface 81A of the circuit board body 81. The harness 95 electrically connects the ceramic board 93 and the circuit board body 81 to each other.

Figure 4B:
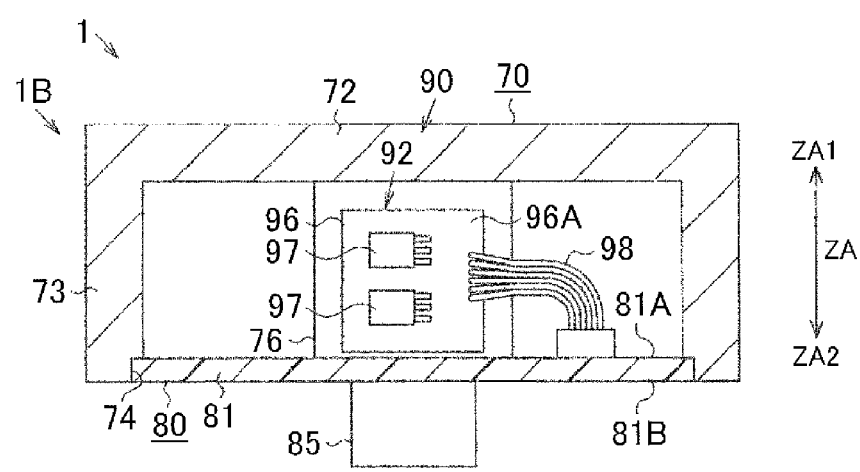
FIG. 4B is a sectional view that shows a sectional structure of the control device according to the first embodiment along the Z1B-Z1B plane in FIG. 1.

As shown in FIG. 4B, the second power board 92 is fixed to the side face of the resolver connector support portion 76. The second power board 92 has a planar shape oriented in the axial direction. The second power board 92 faces the second flat portion 73B of the side wall 73 (see FIG. 1). The second power board 92 includes a ceramic board 96, two field-effect transistors that serve as the power elements 97, and a harness 98.

The ceramic board 96 is formed of alumina. The ceramic board 93 has a planar shape oriented in the axial direction ZA. The ceramic board 96 has a principal surface 96A and a back surface 96B (see FIG. 1). In the ceramic board 96, the power elements 97 are mounted on the principal surface 96A. The back surface 96B of the ceramic board 96 is fixed to the resolver connector support portion 76. The principal surface 96A corresponds to "second principal surface". The back surface 96B corresponds to "second back surface".

The power elements 97 contact the second flat portion 73B at portions across from the ceramic board 96 (see FIG. 1). One end portion of the harness 98 is connected to the principal surface 96A of the ceramic board 96, and the other end of the harness 98 is connected to the principal surface 81A of the circuit board body 81. The harness 98 electrically connects the ceramic board 96 and the circuit board body 81 to each other.

Figure 5:
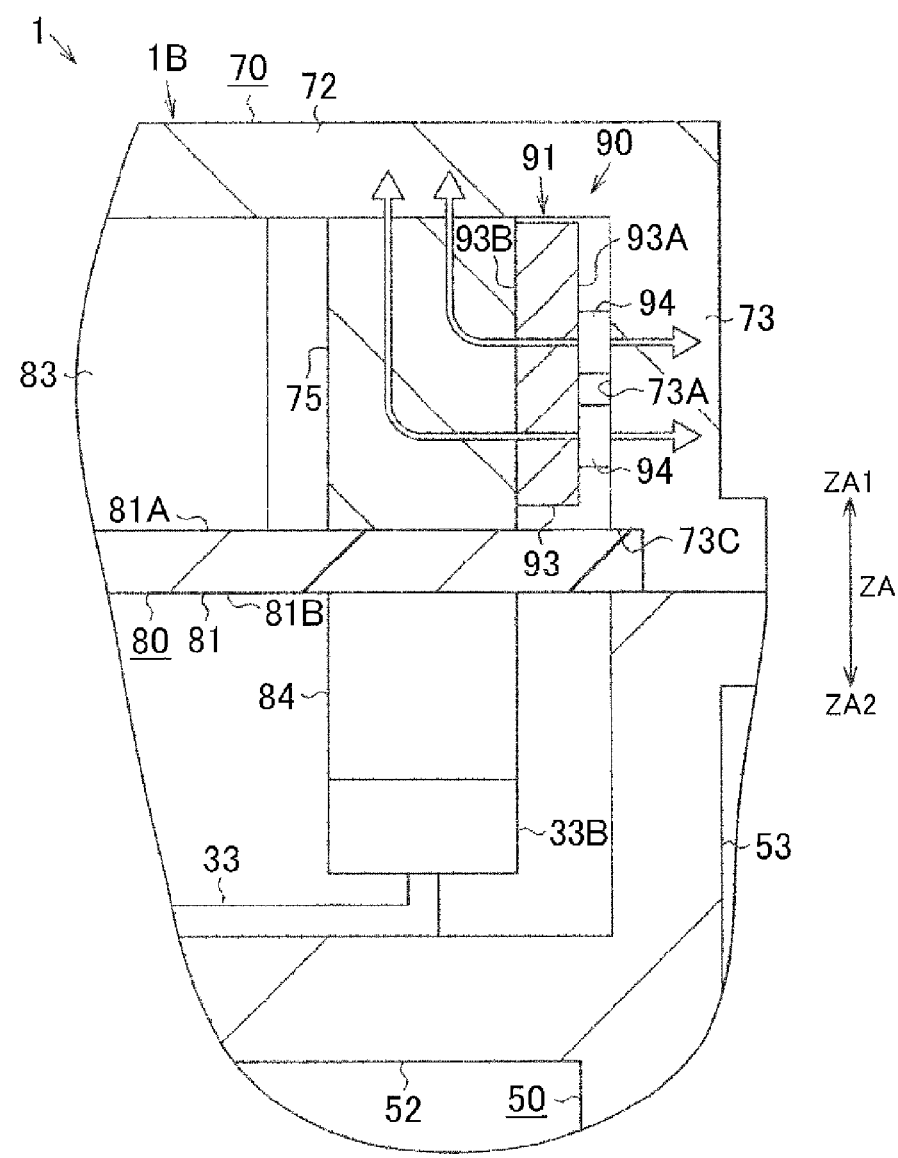
FIG. 5 is a sectional view of the motor unit according to the first embodiment, and is a sectional view that shows a sectional structure of a second circuit board in FIG. 1 and its surroundings.

The operation of the control device 1B will be described with reference to FIG. 1 and FIG. 5. As shown in FIG. 1, in the control device 1B, the first circuit board 80 has the circuit board body 81 parallel to the radial direction ZB, and the second circuit board 90 has a planar shape oriented in the axial direction ZA. That is, the second circuit board 90 is upright with respect to the first circuit board 80. Therefore, in comparison with a configuration that the first circuit board 80 and the second circuit board 90 are integrally formed as a single circuit board, it is possible to reduce the size of the control device 1B in the radial direction ZB.

The control device 1B has a first function and a second function. The first function is the function of suppressing deformation of the circuit board body 81. The second function is the function of dissipating heat from the power elements 94, 97.

The details of the first function of the control device 1B will be described. As shown in FIG. 5, the bus bar connector 84 receives a load in the upward direction ZA1 when the connector portion 33B of the circuit connection member 33 is connected to the bus bar connector 84. Therefore, the bus bar connector 84 presses the circuit board body 81 in the upward direction ZA1. Because the principal surface 81A of the circuit board body 81 contacts the bus bar connector support portion 75, the load that acts on the circuit board body 81 is received by the bus bar connector support portion 75. Therefore, deformation of the circuit board body 81 in the upward direction ZA1 is suppressed. Connection of the resolver connector 85 and the circuit connection member 63 (see FIG. 1) is similar, so the description thereof is omitted.

The details of the second function of the control device 1B will be described. When the motor unit 1 is driven, the power elements 94 of the first power board 91 generate heat. As shown in FIG. 5, heat of the power elements 94 is transferred in order of the ceramic board 93, the bus bar connector support portion 75 and the bottom wall 72. Then, the heat of the bottom wall 72 is dissipated to the outside of the housing 70. Heat of the power elements 94 is dissipated to the outside of the housing 70 via the first flat portion 73A of the side wall 73. In this way, the control device 1B has two heat dissipation paths for the power elements 94. Therefore, in comparison with a configuration that the number of heat dissipation paths is one, cooling performance for the power elements 94 improves. This also applies to the second power board 92, so the description of heat dissipation of the power elements 97 of the second power board 92 (see FIG. 4) is omitted.

The motor unit 1 according to the present embodiment has the following advantageous effects.

(1) The control device 1B has such a structure that the second circuit board 90 is upright with respect to the first circuit board 80. With this configuration, in comparison with a configuration that the first circuit board 80 and the second circuit board 90 are integrally formed as a single circuit board, it is possible to reduce the size of the control device 1B in the radial direction ZB.

(2) In the control device 1B, the power elements 94, 97 contact the side wall 73 of the housing 70. With this configuration, heat of the power elements 94, 97 is transferred to the side wall 73. Therefore, a rise in the temperature of the power elements 94, 97 is suppressed.

(3) In the control device 1B, a portion of the circuit board body 81, corresponding the bus bar connector 84, is supported by the bus bar connector support portion 75. With this configuration, a load that acts on the circuit board body 81 as a result of connecting the circuit connection member 33 of the bus bar 30 to the bus bar connector 84 is received by the bus bar connector support portion 75. Therefore, deformation of the circuit board body 81 is suppressed. Heat of the power elements 94 flows to the bus bar connector support portion 75. Therefore, a rise in the temperature of the power elements 94 is suppressed. In this way, the bus bar connector support portion 75 has the two functions, so it is possible to reduce the number of components that constitute the control device 1B.

(4) In the control device 1B, a portion of the circuit board body 81, corresponding the resolver connector 85, is supported by the resolver connector support portion 76. With this configuration, a load that acts on the circuit board body 81 as a result of connecting the circuit connection member 63 of the resolver 60 to the resolver connector 85 is received by the resolver connector support portion 76. Therefore, deformation of the circuit board body 81 is suppressed. Heat of the power elements 97 flows to the resolver connector support portion 76. Therefore, a rise in the temperature of the power elements 97 is suppressed. In this way, the resolver connector support portion 76 has the two functions, so it is possible to reduce the number of components that constitute the control device 1B.

(5) In a configuration that the electrolytic capacitors 87 and the toroidal coil 88 are mounted on the back surface 81B of the circuit board body 81, when the electrolytic capacitors 87 and the toroidal coil 88 are mounted on a portion of the circuit board body 81, corresponding to the bearing support portion 55, the electrolytic capacitors 87 and the toroidal coil 88 interfere with the bearing support portion 55. Therefore, it is required to increase the space between the cover portion 52 and the circuit board body 81 in the axial direction ZA or mount the electrolytic capacitors 87 and the toroidal coil 88 on a portion of the circuit board body 81, corresponding to the bearing support portion 55.

In contrast to this, in the control device 1B, on the principal surface 81A of the circuit board body 81 of the first circuit board 80, the electrolytic capacitors 87 and the toroidal coil 88 are located between the bus bar connector support portion 75 and the resolver connector support portion 76 in the radial direction ZB. With this configuration, it is possible to effectively utilize the space between the bottom wall 72 and the circuit board body 81, the space being formed in order for the bus bar connector support portion 75 and the resolver connector support portion 76 to be located. Therefore, in comparison with a configuration that the electrolytic capacitors 87 and the toroidal coil 88 are mounted on the back surface 81B of the circuit board body 81, it is possible to suppress an increase in the size of the motor unit 1 in the axial direction ZA and to suppress a decrease in the flexibility of arrangement of the electrolytic capacitors 87 and the toroidal coil 88.

(6) In the motor unit 1, the bus bar connector 84 and the resolver connector 85 overlap with the bearing support portion 55 in the axial direction ZA. With this configuration, in comparison with a configuration that the bus bar connector 84 and the resolver connector 85 are located at a portion different from the bearing support portion 55 in the axial direction ZA, it is possible to reduce the size of the motor unit 1 in the axial direction ZA.

Second Embodiment

Figure 6:
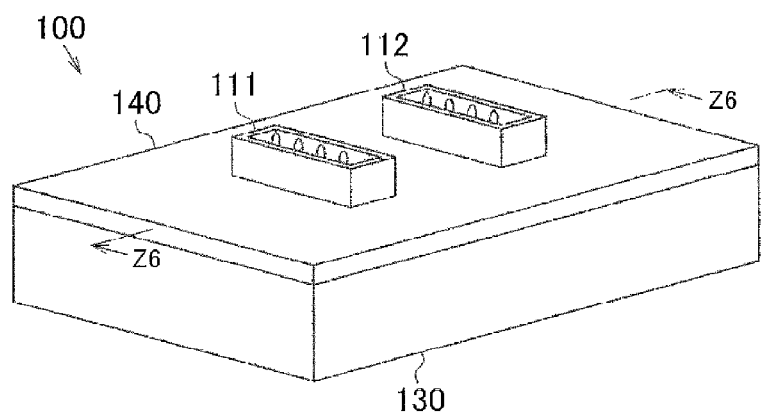
FIG. 6 is a perspective view that shows a perspective structure of a control device according to a second embodiment of the invention.
Figure 7:
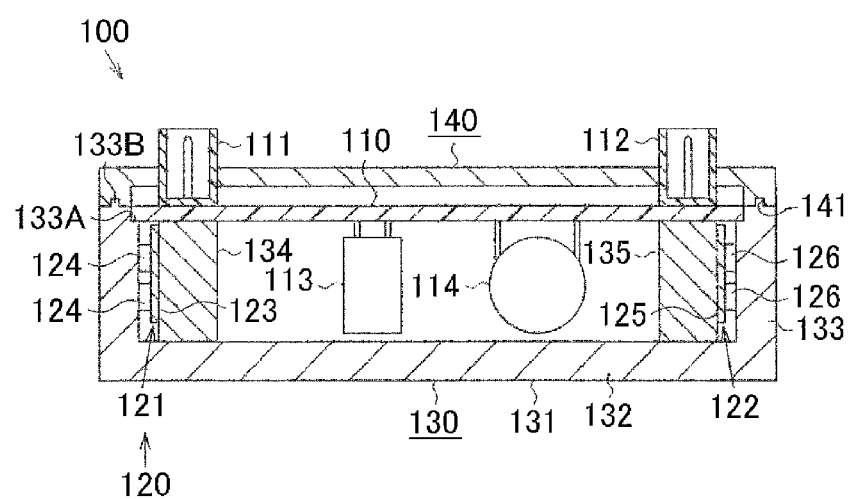
FIG. 7 is a sectional view of the control device according to the second embodiment of the invention, and is a sectional view that shows a sectional structure along the Z6-Z6 plane in FIG. 6.

FIG. 6 and FIG. 7 show the configuration of a control device 100 according to the present embodiment. The control device 100 according to the present embodiment differs from the control device 1B (see FIG. 1) according to the first embodiment in that the control device 100 is separately formed from the electric motor 1A (see FIG. 1). In the following description, components of the second embodiment, which are described such that the components correspond to the components of the first embodiment, have equivalent or similar functions to those of the corresponding components of the first embodiment.

As shown in FIG. 7, the control device 100 includes a first circuit board 110, a second circuit board 120, a housing 130 and a cover 140. The housing 130 is formed of a metal material. The housing 130 has a box shape having a rectangular shape in plan view (see FIG. 6). The housing 130 accommodates the first circuit board 110 and the second circuit board 120. The housing 130 has a housing body 131, a bus bar connector support portion 134 and a resolver connector support portion 135. In the housing 130, the housing body 131, the bus bar connector support portion 134 and the resolver connector support portion 135 are individually formed. The bus bar connector support portion 134 and the resolver connector support portion 135 correspond to "connector support portion".

The housing body 131 has a bottom wall 132 and a side wall 133. The housing body 131 has such a structure that the bottom wall 132 and the side wall 133 are integrally molded from the same metal material. The side wall 133 has a step portion 133A and a fitting protrusion 133B. The side wall 133 has the step portion 133A at its upper end portion. The side wall 133 supports the first circuit board 110 at the step portion 133A. The side wall 133 has the fitting protrusion 133B at its upper end face.

The structure of the bus bar connector support portion 134 corresponds to the structure of the bus bar connector support portion 75 according to the first embodiment. The bus bar connector support portion 134 faces the side wall 133 via a space. The bus bar connector support portion 134 is parallel to the side wall 133.

The structure of the resolver connector support portion 135 corresponds to the structure of the resolver connector support portion 76 according to the first embodiment. The resolver connector support portion 135 faces the side wall 133 via a space. The resolver connector support portion 135 is parallel to the side wall 133.

The cover 140 covers the side wall 133 of the housing 130 across from the bottom wall 132. The cover 140 is fixed to the side wall 133 of the housing 130 by bolts (not shown). The cover 140 has a fitting recess 141. The fitting recess 141 is fitted to the fitting protrusion 133B.

The first circuit board 110 has a planar shape. The first circuit board 110 is parallel to the bottom wall 132. The first circuit board 110 has a control circuit corresponding to the control circuit of the first circuit board 80 according to the first embodiment. The first circuit board 110 is located across a space from the bottom wall 132. The first circuit board 110 is located across a space from the cover 140. The first circuit board 110 is formed as a multilayer printed circuit board in which a plurality of thermoplastic resin films are laminated. The first circuit board 110 includes a bus bar connector 111, a resolver connector 112, electrolytic capacitors 113 and a toroidal coil 114. The bus bar connector 111, the resolver connector 112, the electrolytic capacitors 113 and the toroidal coil 114 respectively correspond to the bus bar connector 84, the resolver connector 85, the electrolytic capacitors 87 and the toroidal coil 88 according to the first embodiment. The bus bar connector 111 and the resolver connector 112 correspond to "connector".

The bus bar connector 111 and the resolver connector 112 are mounted on the surface of the first circuit board 110, facing the cover 140. The electrolytic capacitors 113 and the toroidal coil 114 are mounted on the surface of the first circuit board 110, facing the bottom wall 132. The electrolytic capacitors 113 and the toroidal coil 114 are located between the bus bar connector support portion 134 and the resolver connector support portion 135.

The second circuit board 120 has a power circuit that corresponds to the power circuit of the second circuit board 90 according to the first embodiment. The second circuit board 120 includes a first power board 121 and a second power board 122.

The configuration of the first power board 121 corresponds to the configuration of the first power board 91 according to the first embodiment. The first power board 121 includes a ceramic board 123, power elements 124 and a harness (not shown). The power elements 124 contact the side wall 133.

The configuration of the second power board 122 corresponds to the configuration of the second power board 92 according to the first embodiment. The second power board 122 includes a ceramic board 125, power elements 126 and a harness (not shown). The power elements 126 contact the side wall 133.

The operation of the control device 100 is similar to the operation of the control device 1B, so the description thereof is omitted. The control device 100 according to the present embodiment has similar advantageous effects to the advantageous effects (1) to (5) of the motor unit 1 according to the first embodiment.

Other Embodiments

The invention includes embodiments other than the first and second embodiments. Hereinafter, alternative embodiments to the first and second embodiments will be described as other embodiments of the invention. The following alternative embodiments may be combined with each other.

Figure 8:
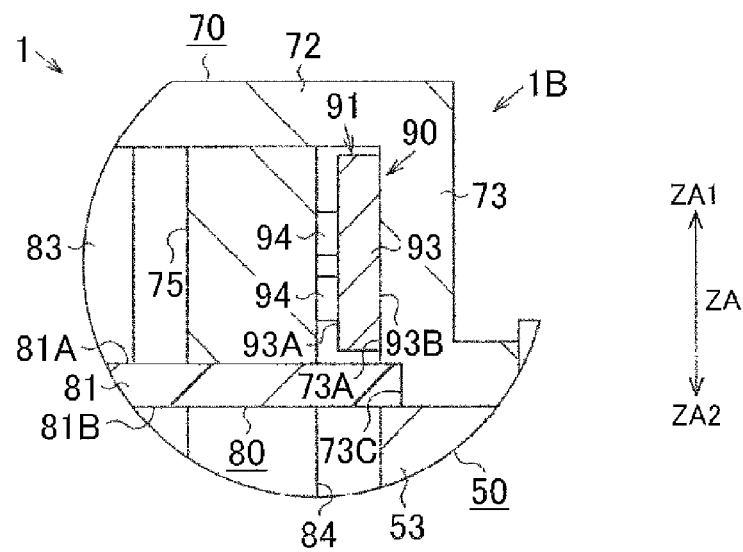
FIG. 8 is a sectional structure of a motor unit according to another embodiment of the invention, and is a sectional view that shows a sectional structure corresponding to the sectional structure of the second circuit board shown in FIG. 1 and its surroundings.

In the control device 1B according to the first embodiment, the first power board 91 is fixed to the bus bar connector support portion 75, and the second power board 92 is fixed to the resolver connector support portion 76. In contrast, the control device 1B according to an alternative embodiment has at least one of a configuration that the first power board 91 is fixed to the first flat portion 73A of the side wall 73 and a configuration that the second power board 92 is fixed to the second flat portion 73B. For example, as shown in FIG. 8, in the configuration that the first power board 91 is fixed to the first flat portion 73A, the power elements 94 contact the bus bar connector support portion 75. Although not shown in the drawing, in the configuration that the second power board 92 is fixed to the second flat portion 73B, the power elements 97 contact the resolver connector support portion 76. A similar modification may be added to the control device 100 according to the second embodiment.

Figure 9:
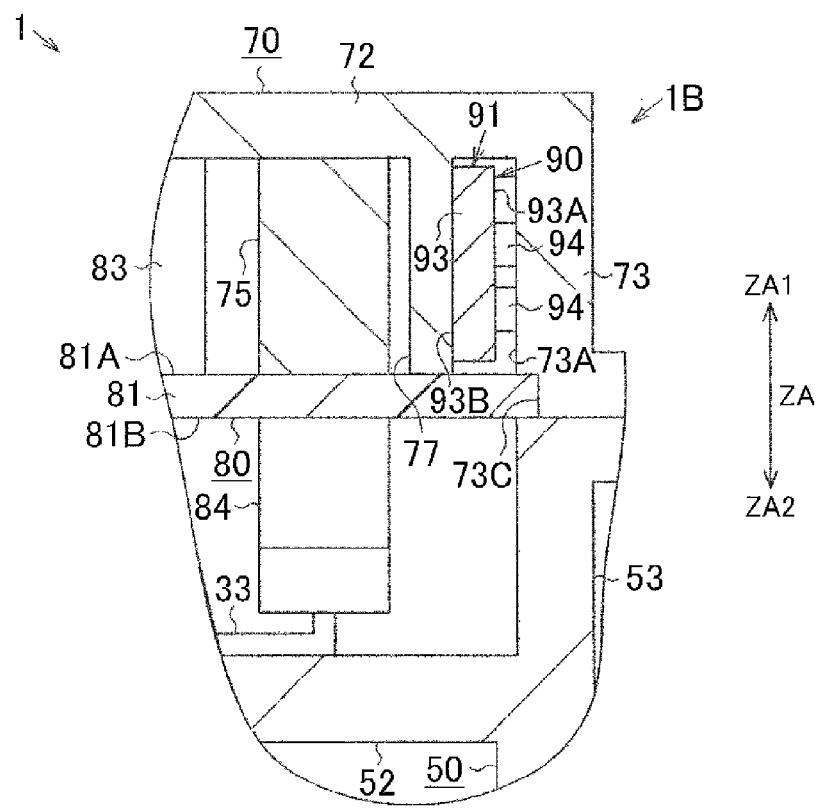
FIG. 9 is a sectional view of a motor unit according to another embodiment of the invention, and is a sectional view that shows a sectional structure corresponding to the sectional structure of the second circuit board shown in FIG. 1 and its surroundings.

In the control device 1B according to another alternative embodiment, as shown in FIG. 9, the first power board 91 is fixed to a board support portion 77 of the housing 70. The board support portion 77 is integrally formed with the housing body 71 from the same metal material. The board support portion 77 is located on the bottom wall 72 between the bus bar connector support portion 75 and the first flat portion 73A. The board support portion 77 extends in the downward direction ZA2 from the bottom wall 72 in a state where the board support portion 77 is oriented in the axial direction ZA. The ceramic board 93 is fixed to the side face of the board support portion 77, facing the first flat portion 73A. The power elements 94 contact the first flat portion 73A. Although not shown in the drawing, in the second circuit board 90, the second power board 92 is fixed to the board support portion between the resolver connector support portion 76 and the second flat portion 73B. A similar modification may be added to the control device 100 according to the second embodiment.

In the control device 1B according to the first embodiment, the power elements 94 contact the first flat portion 73A of the side wall 73. In contrast, in the control device 1B according to an alternative embodiment, the power elements 94 are located at a predetermined distance from the first flat portion 73A of the side wall 73. The predetermined distance is shorter than or equal to the height of the power elements 94 from the ceramic board 93. In short, the power elements 94 are not limited to the configuration that the power elements 94 contact the first flat portion 73A; the power elements 94 may be located across a clearance from the first flat portion 73A to such an extent that it is possible to ensure required cooling performance for the power elements 94. Here, the configuration that "power elements face the side wall" includes the configuration that the power elements contact the side wall and the configuration that the power elements are located across a clearance from the side wall to such an extent that it is possible to ensure required cooling performance for the power elements.

In the control device 1B according to the first embodiment, the bus bar connector support portion 75 contacts the principal surface 81A of the circuit board body 81. In contrast, in the control device 1B according to an alternative embodiment, the bus bar connector support portion 75 faces the principal surface 81A of the circuit board body 81 via a clearance. A similar modification may be added to the control device 100 according to the second embodiment.

In the control device 1B according to the first embodiment, the resolver connector support portion 76 contacts the principal surface 81A of the circuit board body 81. In contrast, in the control device 1B according to an alternative embodiment, the resolver connector support portion 76 faces the principal surface 81A of the circuit board body 81 via a clearance. A similar modification may be added to the control device 100 according to the second embodiment.

The control device 1B according to the first embodiment includes the housing 70 in which the bus bar connector support portion 75, the resolver connector support portion 76 and the housing body 71 are individually formed. In contrast, the control device 1B according to an alternative embodiment includes the housing 70 in which at least one of the bus bar connector support portion 75 and the resolver connector support portion 76 is integrally formed with the housing body 71 from the same metal material. A similar modification may be added to the control device 100 according to the second embodiment.

The control device 1B according to the first embodiment has such a structure that the first circuit board 80 is formed as a multilayer printed circuit board in which a plurality of thermoplastic resin films are laminated. In contrast, the control device 1B according to an alternative embodiment has such a structure that the first circuit board 80 is formed as a printed circuit board having a thermoplastic resin base material. A similar modification may be added to the control device 100 according to the second embodiment.

The control device 1B according to the first embodiment includes the first circuit board 80 that has the circuit board body 81, the coupling portion 82 and the perpendicular board portion 83. In contrast, the control device 1B according to an alternative embodiment includes the first circuit board 80 in which at least one of the coupling portion 82 and the perpendicular board portion 83 is omitted.

The electric motor 1A according to the first embodiment includes the resolver 60 as a rotation position detecting device. In contrast, the electric motor 1A according to an alternative embodiment has a Hall IC instead of the resolver 60 as a rotation position detecting device. In addition, the electric motor 1A according to another alternative embodiment is configured as a sensorless motor in which a rotation position detecting device is omitted. In the electric motor 1A according to the above other alternative embodiment, the resolver support portion 54 is omitted from the bracket 50, the resolver connector 85 is omitted from the first circuit board 80, and the resolver connector support portion 76 is omitted from the housing 70.

What is claimed is:

1. A control device comprising:
a metal housing having a bottom wall and a side wall;
a first circuit board having a first principal surface, the first principal surface facing the bottom wall; and
a second circuit board upright with respect to the first circuit board, and having a second principal surface and a power element, the power element being mounted on the second principal surface and facing the side wall, wherein
the first circuit board has a first back surface and a connector, the first back surface being a surface across the first circuit board from the first principal surface, the connector being mounted on the first back surface,
the housing has a metal connector support portion, the connector support portion being arranged between the bottom wall and the first principal surface,
a portion of the first principal surface, corresponding to the connector, is supported by the connector support portion, and
the second circuit board is mounted on the connector support portion.

2. The control device according to claim 1, wherein
the first circuit board is a multilayer printed circuit board in which a plurality of thermoplastic resin films are laminated.

3. A motor unit comprising:
the control device according to claim 1.

* * * * *